United States Patent
Suda et al.

(10) Patent No.: US 7,625,447 B2
(45) Date of Patent: Dec. 1, 2009

(54) METHOD OF GROWING SEMICONDUCTOR CRYSTAL

(75) Inventors: Jun Suda, Shiga (JP); Hiroyuki Matsunami, Kyoto (JP); Norio Onojima, Kyoto (JP)

(73) Assignee: Japan Science and Technology Agency, Saitama (JP)

( * ) Notice: Subject to any disclaimer, the term of this patent is extended or adjusted under 35 U.S.C. 154(b) by 290 days.

(21) Appl. No.: 10/549,683

(22) PCT Filed: Mar. 18, 2004

(86) PCT No.: PCT/JP2004/003689

§ 371 (c)(1),
(2), (4) Date: Sep. 19, 2005

(87) PCT Pub. No.: WO2004/084283

PCT Pub. Date: Sep. 30, 2004

(65) Prior Publication Data

US 2006/0180077 A1     Aug. 17, 2006

(30) Foreign Application Priority Data

Mar. 19, 2003    (JP) .................................. 2003-076044

(51) Int. Cl.
*C30B 23/00* (2006.01)

(52) U.S. Cl. ............................ 117/94; 117/84; 117/88; 117/89; 117/90; 117/92; 117/97; 117/100; 117/101; 117/103; 117/105; 117/106; 117/108; 117/109; 117/951; 117/952

(58) Field of Classification Search .................... 117/84, 117/88, 89, 90, 92, 94, 97, 100, 101, 103, 117/105, 106, 108, 109, 951, 952
See application file for complete search history.

(56) References Cited

U.S. PATENT DOCUMENTS 5,760,426 A * 6/1998 Marx et al. ................. 257/190
6,165,874 A * 12/2000 Powell et al. ............... 438/478
6,273,950 B1 * 8/2001 Kitabatake ................... 117/95

(Continued)

FOREIGN PATENT DOCUMENTS

CN              489142         10/1999

(Continued)

OTHER PUBLICATIONS

Li et al, "Field-ion scanning tunneling microscopy study of the atomic structure of 6H-SiC (0001) surfaces cleaned by in situ Si molecular beam etching," J. Appl. Phys. 80 (4), Aug. 15, 1996, pp. 2524-2526.*

(Continued)

*Primary Examiner*—Robert M Kunemund
*Assistant Examiner*—Matthew J Song
(74) *Attorney, Agent, or Firm*—Stites & Harbison PLLC; Juan Carlos A. Marquez, Esq.

(57) ABSTRACT

SiC is a very stable substance, and it is difficult to control the condition of a SiC surface to be suitable for crystal growth in conventional Group III nitride crystal growing apparatuses. This problem is solved as follows. The surface of a SiC substrate 1 is rendered into a step-terrace structure by performing a heating process in an atmosphere of HCl gas. The surface of the SiC substrate 1 is then treated sequentially with aqua regia, hydrochloric acid, and hydrofluoric acid. A small amount of silicon oxide film formed on the surface of the SiC substrate 1 is etched so as to form a clean SiC surface 3 on the substrate surface. The SiC substrate 1 is then installed in a high-vacuum apparatus and the pressure inside is maintained at ultrahigh vacuum (such as $10^{-6}$ to $10^{-8}$ Pa). In the ultrahigh vacuum state, a process of irradiating the surface with a Ga atomic beam 5 at time t1 at temperature of 800° C. or lower and performing a heating treatment at 800° C. or higher is repeated at least once. The temperature is then set to the growth temperature of an AlN film, and the SiC substrate surface 3 is initially irradiated with Al atoms 8a in ultrahigh vacuum state, followed by the feeding of N atoms 8b.

5 Claims, 12 Drawing Sheets

U.S. PATENT DOCUMENTS

| | | | |
|---|---|---|---|
| 6,447,604 | B1 | 9/2002 | Flynn et al. |
| 2001/0015170 | A1* | 8/2001 | Kitabatake .................. 117/95 |
| 2002/0158258 | A1 | 10/2002 | Chyi |
| 2003/0136333 | A1* | 7/2003 | Semond et al. .............. 117/95 |
| 2004/0164341 | A1* | 8/2004 | Forbes et al. ............... 257/315 |

FOREIGN PATENT DOCUMENTS

| | | |
|---|---|---|
| CN | 503590 | 4/2001 |
| CN | 516102 | 6/2001 |
| JP | 09-181355 | 12/1995 |
| JP | 11-145514 | 11/1997 |
| WO | WO 01/95380 A1 * | 12/2001 |

OTHER PUBLICATIONS

Kugimiya et al., "Si-Beam Radiation Cleaning in Molecular beam epitaxy," Japanese Journal of Applied Physics vol. 24, No. 5, May 1985, pp. 564-567.*

Norio Onojima et al., " Molecular-Beam Epitaxial Growth of Insulating AlN on Surface-Controlled 6H-SiC Substrate by HCl Gas Etching", Applied Physics Letters, vol. 80, No. 1 (Jan. 7, 2002), pp. 76-78.

Norio Onojima et al., "High-Quality AlN by Initial Layer-by-Layer Growth on Surface-Controlled 4H-SiC(0001) Substrate", Jpn. J. Appl. Phys. vol. 42, Part 2, No. 5A (May 1, 2003), pp. L445-L447.

N. Onojima et al., "Impact of SiC Surface Control on Initial Growth Mode and Crystalline Quality of AlN Grown by Molecular-Beam Epitaxy", Phys. Stat. Sol. (c) 0, No. 7 (2003), pp. 2529-2532/DOI 10.1002/pssc.200303358.

Jun Suda et al., "Either Step-Flow or Layer-by-Layer Growth for AlN on SiC (0001) Substrates", Mat. Res. Soc. Symp. Proc., vol. 798 (2004), © Materials Research Society, pp. Y3.4.1-Y3.4.6.

Chinese Office Action dated Jul. 21, 2008 regarding Taiwanese R.O.C. patent application No. 093107211, in Chinese language.

Norio Onojima et al., "Lattice Relaxation Process of AlN Growth on Atomically Flat 6H-SiC Substrate in Molecular Beam Epitaxy", Journal of Crystal Growth (2002), pp. 1012-1016.

Steve Wright et al., "Reduction of Oxides on Silicon by Heating in a Gallium Molecular Beam at 800° C.ᵃ"", Appl. Phys. Lett, vol. 36, No. 3, Feb. 1, 1980, pp. 210-211.

* cited by examiner

HF AQUEOUS SOLUTION TREATMENT $P = 10^{-6} \sim 10^{-8}$ Pa
$T_s = 600°C \to 1000°C$
$(n \geqq 1)$ $T_s = 400 \sim 1100°C$

HF AQUEOUS SOLUTION TRREATMENT $P_{O_2} = 0.1 Pa$ $T_s = 800 \sim 1000°C$

US 7,625,447 B2

METHOD OF GROWING SEMICONDUCTOR CRYSTAL

TECHNICAL FIELD

The present invention relates to a semiconductor crystal growing technology, and more particularly to a technique for growing Group III nitride crystals on an SiC surface.

BACKGROUND ART

Hexagonal SiC has a very high heat conductivity, and both electrically conductive and insulating substrates are available. Its lattice constant and coefficient of thermal expansion are relatively close to those of AlN and GaN-based Group III nitrides. Another characteristic of hexagonal SiC is that it is a hexagonal crystal and possesses polarities, as to Group III nitrides.

There are high expectations for the realization of a technology for growing high-quality crystals of Group III nitrides on SiC for applications relating to a buffer layer for the formation of a GaN-based device structure on an SiC substrate, or relating to Group III nitride/SiC heterojunction devices. It has been difficult to grow a high-quality Group III nitride layer on SiC because of the mismatch of the stacked structure of SiC and Group III nitrides in the c-direction, or the so-called polytype mismatch. Namely, 4H—SiC and 6H—SiC, which are representative of hexagonal SiC, have structures with 4- and 6-monolayer periods, respectively, in the c-axis direction, while AlN and GaN, which are Group III nitrides, have 2-monolayer periods in the c-axis direction in a structure referred to as the wurtzite structure.

In order to solve this problem, it has been proposed to make the SiC substrate surface a flat plane without any steps, or to control the height of the steps on the SiC substrate surface to be common multiples of the stacking periods of SiC and the Group III nitride. For example, a technology has been proposed whereby a SiC substrate surface is subjected to HCl gas etching so as to form a SiC surface with the aforementioned features, which is followed by the growing of an AlN layer (see Non-patent Document 1: Norio Onojima, Jun Suda, and Hiroyuki Matsunami, "Molecular-beam epitaxial growth of insulating AlN on surface-controlled 6H—SiC substrate by HCl gas etching," Applied Physics Letters, Vol. 80, No. 1, (2002) p. 76-78, for example).

DISCLOSURE OF THE INVENTION

While it is expected that the inconsistency in stacked structures can be resolved by the aforementioned method, there are two additional problems in the crystal growth of Group III nitride on SiC surfaces. One is that the SiC surface is chemically and thermally stable, and it is difficult to control the SiC surface condition unless a high-temperature environment, such as one exceeding 1200° C., is used. Such high-temperature environment, however, is difficult to realize via conventional Group III nitride growth apparatuses.

The second problem is that because the interface of crystal growth is an interface of substances with different chemical bonds, namely IV-IV and III-V, there would be either an excess or a lack of electrons in the formation of covalent bonding, such as in the cases of IV-III or IV-V, at the interface. As a result, the interface could be destabilized and the mode of crystal growth tends to be that of three-dimensional island growth. Thus, it has been difficult to achieve high-quality Group III nitride crystal growth.

It is an object of the invention to provide a technique for growing high-quality Group III nitride crystals on SiC by controlling the surface of SiC and/or through sequence control at the beginning of growth.

In one aspect, the invention provides a crystal growing method comprising the steps of: forming a step-terrace structure that is flat on the atomic level on a SiC surface and then removing an oxide film from the surface; and performing at least one cycle of a process of irradiation of Si or Ga under high vacuum and then heating, and then growing a Group III nitride.

In this crystal growing method, the SiC surface is made flat and clean while the steps thereon are controlled, and then the process of irradiating the surface with Si or Ga. Then it is heated at least once under high vacuum, followed by the growth of a Group III nitride. As a result, the amount of oxygen remaining on the SiC surface can be minimized, and a SiC/Group III nitride with good interface can be formed.

The invention also provides a crystal growing method comprising the steps of: forming a flat and clean SiC surface; and growing a Group III nitride under high vacuum, wherein a Group III element is fed before nitrogen is fed.

In this method, because nitrogen is fed after the Group III element has been fed onto the clean SiC surface, the formation of a nitride layer or an excess Si—N bond due to the reaction of Si and nitrogen on the SiC surface can be prevented. Further, the preceding supply of the Group III element onto the SiC surface helps to reduce the instability at the interface, so that two-dimensional layer-by-layer growth can be realized with good reproducibility.

In another aspect, the invention provides a crystal growing method comprising the steps of: forming a flat and clean SiC surface; growing a Group III nitride under high vacuum, wherein a surface control element for forming a surface control layer for controlling the mode of crystal growth of said Group III nitride on the SiC surface is fed; and feeding a Group III element and nitrogen, followed by the termination of the feeding of said surface control element. Preferably, the surface control element is Ga or In.

By thus feeding the Group III element and nitrogen after the feeding of the surface control element, the formation of a nitride layer of Si or the like on the SiC surface can be prevented regardless of the order of feeding of the Group III element and nitrogen. As a result, a good interface can be formed and the need to control the order of feeding of the Group III element and nitrogen can be eliminated.

In yet another aspect of the invention, the invention provides a crystal growing method comprising the steps of: controlling the SiC surface to acquire a step-terrace structure that is flat on the atomic level; and removing an oxide film from the surface in an atmosphere of reduced oxygen partial pressure and then growing a Group III nitride. In this method, the re-adsorption of oxygen after the step of removing the surface oxide film can be prevented, so that a good-quality single crystal can be formed even without performing a surface oxide-film removing process via Ga irradiation or heating prior to the growth of the Group III nitride.

In yet another aspect, the invention provides a stacked structure comprising: an SiC layer; a Group III nitride layer; and Ga atoms or In atoms remaining between said SiC layer and said Group III nitride layer.

BEST MODES FOR CARRYING OUT THE INVENTION

The technique for growing Group III crystals on SiC according to embodiments of the invention will be described with reference to the drawings. The term "SiC surface" herein includes both the surface of a SiC substrate and the surface of a SiC layer deposited on different types of materials, such as a Si substrate and a sapphire substrate. The term "SiC substrate" also includes substrates on the surface of which SiC exists.

The term "Group III nitride" refers to nitrides containing N and at least one of Group III elements B, Al, Ga, or In. The nitrides may include elements other than N as the Group V element. They may also include not only compounds such as GaN or AlN, but also mixed crystals, such as $Al_xIn_yGa_{1-x-y}N$.

Figure 1:
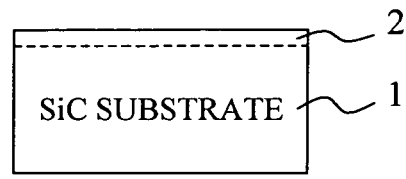
FIG. 1 schematically shows the steps of growing a Group III nitride crystal on SiC in accordance with an embodiment of the invention.
Figure 1:
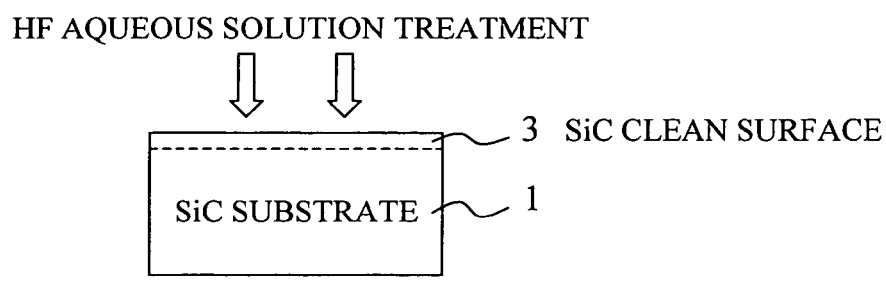
Figure 1:
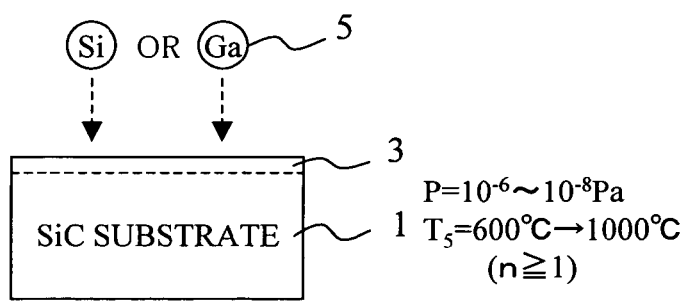
Figure 1:
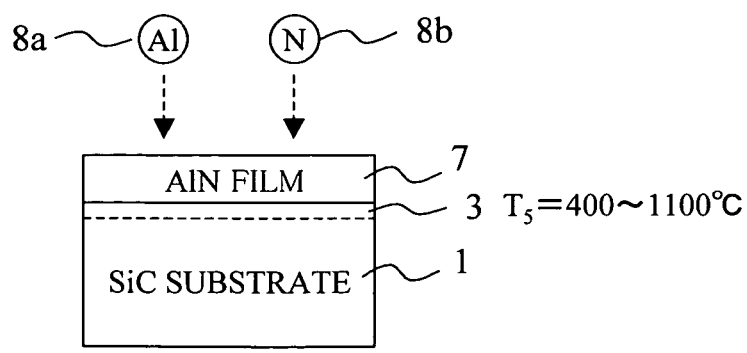

Initially, the crystal growth technique according to a first embodiment of the invention will be described with reference to the drawings. FIG. 1 schematically shows a process chart of the steps for growing a crystal of a Group III nitride on SiC according to the first embodiment. FIGS. 2(A) and (B) show growth sequence charts illustrating the relationship between the grown-element feed time (which is controlled by the switching on and off of the shutter, for example, in the case of MBE) and growth temperature before and after the growth of crystal of the Group III nitride.

Figure 2:
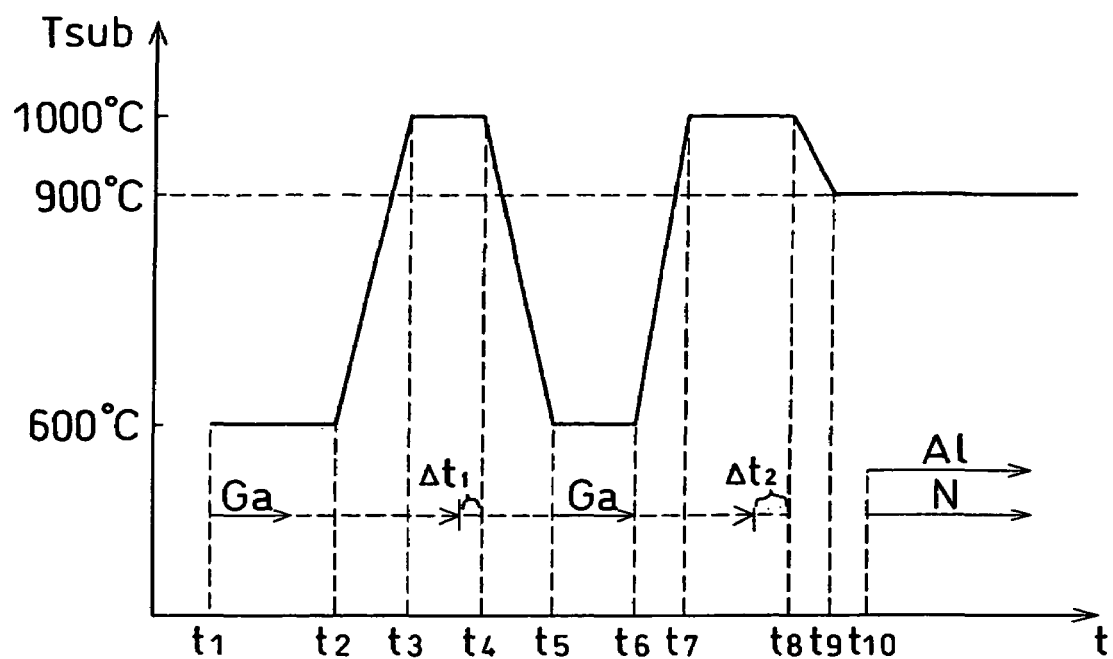
FIG. 2(A) shows a sequence chart regarding the feed timing of a growth element (which is controlled by turning on or off a shutter or the like in the case of MBE) before and after the crystal growth of a Group III nitride on SiC in accordance with a first embodiment of the invention.
FIG. 2(B) shows a sequence chart illustrating a variation of the crystal growing method of FIG. 2(A).
Figure 2:
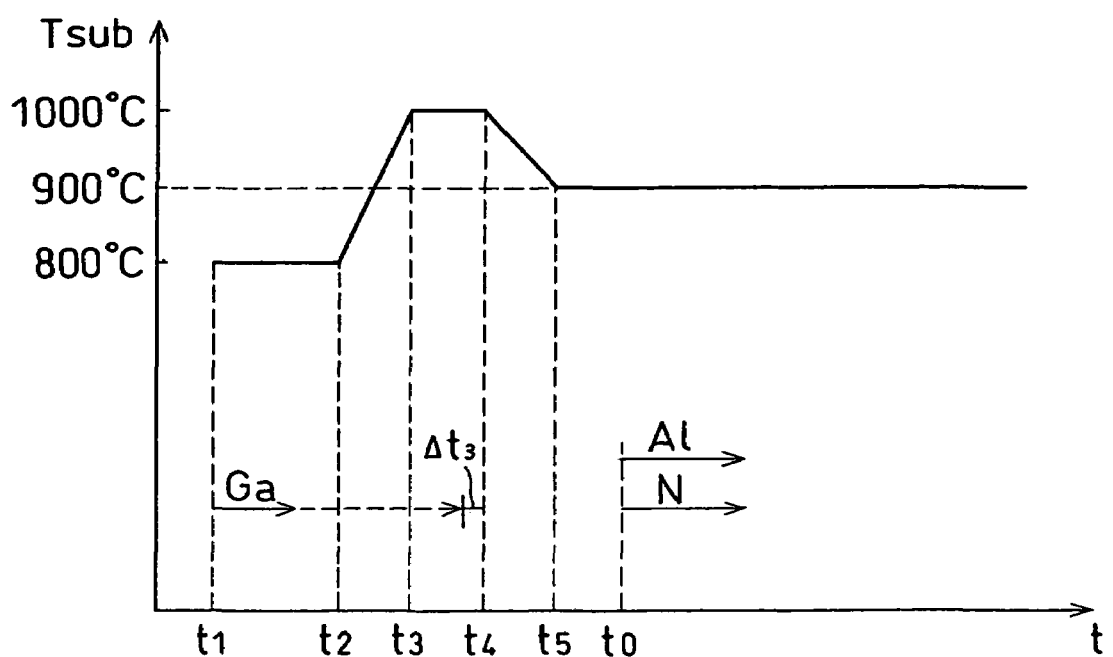

In the following, the step of growing a crystal is described with reference to FIGS. 1 and 2. Initially, a washed 4H—SiC $(0001)_{Si}$ substrate 1 (which may alternatively be comprised of 6H—SiC) is prepared (which is either a just substrate or a substrate with an offset angle of not more than 15° in an arbitrary crystal direction. With greater offset angles, problems regarding the proximity of the steps or the formation of a facet would arise, which would then require the consideration of another crystal growth mechanism). The substrate is then subjected to heat treatment in an atmosphere of HCl gas diluted with hydrogen gas in a quartz furnace (with a flowrate of hydrogen gas, which is the carrier gas, of 1 slm and a flowrate of HCl gas of 3 sccm) at 1300° C. for 10 minutes, for example. The etch rate of SiC under these conditions is approximately 0.3 μm/h. Through such a gas etching process, the surface of the SiC substrate is formed into a step-terrace structure consisting of terraces that are flat on the atomic level and steps, as mentioned above. The width of the terraces depends on the plane orientation of the substrate (off-angle). For example, if there is an offset angle of approximately 0.2° with respect to the $(0001)_{Si}$ plane, the terrace width would be on the micrometers order. The height of the steps can be controlled to result in 4 monolayers by adjusting the angle of inclination of the SiC substrate surface, the crystal orientation in the direction of inclination, and gas etching conditions. Instead of gas etching, or following gas etching, homoepitaxial growth of SiC may be carried out (as shown by layer 2 in FIG. 1(A)). It is also possible to form a surface with the aforementioned step height by adjusting the growth conditions during homoepitaxial growth. Carrying out homoepitaxial growth, which allows the formation of a SiC layer with better quality than the substrate, is useful for the formation of a better-quality Group III nitride layer or for the preparation of a device in which a Group III nitride/SiC interface is used.

Following the gas etching, the SiC substrate is taken out to the atmosphere. When the thus taken-out substrate was evaluated using an atomic force microscope, it was revealed that the substrate surface had a step-terrace structure, with the terrace surface being flat on the atomic level. The height of the steps was equal to 4 monolayers. It can be seen that by providing the surface of the SiC substrate with the aforementioned structure prior to the growth of the Group III nitride, one of the conditions for growing a high-quality structure can be satisfied.

Then, as shown in FIG. 1(B), the surface of the SiC substrate 1 taken out into the atmosphere was treated with aqua regia, hydrochloric acid, and hydrofluoric acid sequentially. By the hydrofluoric acid process, a minute amount of silicon oxide film formed on the surface of the SiC substrate 1 can be removed. On the surface of the substrate, there is formed a clean surface 3 of SiC. When the thus treated substrate was evaluated using an atomic force microscope, a step-terrace structure was observed on the surface of the SiC substrate 1. It was thus observed that the step-terrace structure on the surface does not change and can be maintained even after the foregoing chemical treatment. When the surface was further analyzed by X-ray photoelectron spectroscopy (XPS), it was revealed that the amount of oxygen on the surface was greatly reduced by the treatment involving aqua regia, hydrochloric acid, and hydrofluoric acid. However, it was also confirmed that a minute and yet significant amount of oxygen remained.

As shown in FIG. 1(C) and FIG. 2(A), the SiC substrate 1 was installed in a high-vacuum apparatus, such as an MBE (molecular beam epitaxy) apparatus, and the apparatus was maintained in a ultra-high vacuum state (on the order of $10^{-6}$ to $10^{-8}$ Pa, for example). In the ultrahigh vacuum state, an irradiation of a Ga atomic beam 5 was started at time t1 at temperature of not 800° C. or higher (600° C. in the illustrated example). The temperature was then increased to more than 800° C. (1000° C. in the illustrated example) between time t2 and t3, and the high temperature was maintained in the period t3 to t4.

The process of heating and maintaining a certain temperature was carried out at least once (twice in the illustrated example) and preferably repeated three times or more. Preferably, the Ga irradiation is interrupted during heating (as indicated by the solid line). However, similar results would be obtained by continuing the Ga irradiation during the period t3 to t4 and then terminating at t4 (as indicated by the broken line). In this case, by providing intervals $\Delta t1$ and $\Delta t2$ from the interruption of Ga until the lowering of temperature, time may be provided for the separation of Ga from the surface. Alternatively, Ga may be continuously fed until t8 or t8–$\Delta t2$. Thereafter, the temperature is lowered from 1000° C. to 600° C. between t4 and t5, and Ga is again irradiated at t5 and the temperature is maintained until t6. Then, the irradiation of Ga is interrupted at t6 and the temperature is increased to 1000° C. until t7. The irradiation of Ga may similarly be interrupted at time t8, which is at the end of the period in which the temperature is maintained at 1000° C., without interrupting at time t6. Thereafter, the temperature is lowered to 900° C., for example, between t8 and t9, and Al and N are fed simultaneously at time t10, when the growth of AlN begins.

Instead of the Ga atomic beam 5, or in addition to the Ga atoms, a Si atomic beam may be shone. As a result of surface analysis using XPS, it was shown that the amount of oxygen on the surface after the Ga irradiation and heating process was below the measuring limit of the measuring apparatus. Thus, through the Ga irradiation and the subsequent heating process, it became possible to virtually completely remove the oxygen on the surface that had not been completely removed by the hydrofluoric acid process or that had been adsorbed via the atmosphere while the substrate was being mounted on the MBE apparatus following the hydrofluoric acid process.

Regarding the details of the AlN growing step, the temperature is set to the growth temperature for the AlN film (Ts=400° C. to 1100° C. for example; 900° C. in the illustrated example), and Al atoms 8a and N atoms 8b are fed to the surface of the SiC substrate in a ultrahigh vacuum state (such as $10^{-6}$ to $10^{-8}$ Pa), as shown in FIG. 1(D). The degree of vacuum during growth is determined by the balance between the amount of N atoms that are fed and the evacuating performance of the growing apparatus. Under the general growth conditions, the degree of vacuum would be on the order of $10^{-2}$ to $10^{-4}$ Pa. The N atoms 8b were fed to the substrate surface by the rf-MBE method using rf-plasma excited active nitrogen, for example. From this point in time on, an AlN layer 7 can be grown on the SiC substrate 1, as shown in FIG. 1(D).

Figure 3:
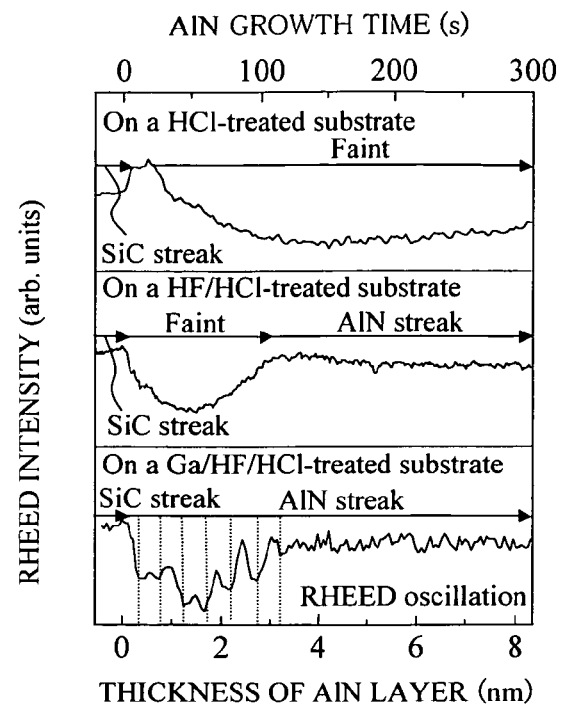
FIG. 3(A) shows the result of measuring the electron diffraction intensity observed in situ following the start of growth of an AlN layer.
FIG. 3(B) shows measurement results obtained when the growth temperature of the AlN layer was lowered.
Figure 3:
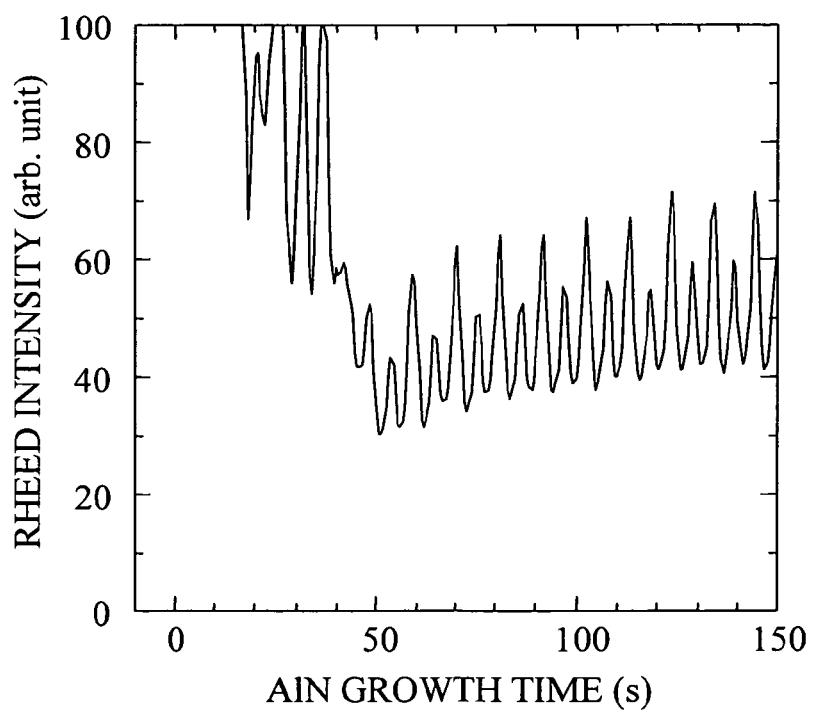

FIG. 3 shows the result of measurement of electron diffraction (RHEED) observed in situ following time t10, when the growth of the AlN layer 7 began. FIG. 3 also shows the changes in the RHEED intensity in a sample in which AlN was grown without the Ga atomic beam irradiation of FIG. 1(C), and in another sample in which the hydrofluoric acid process of FIG. 1(B) were additionally omitted, depending on the thickness of the AlN film grown.

As shown in FIG. 3, in the electron diffraction intensity observed in situ after time t3 when the growth of the AlN layer 7 began, no oscillation of RHEED was observed in the sample in which the hydrofluoric acid process and the Ga atomic beam irradiation process had not been performed, and in the sample in which the Ga atomic beam irradiation process had been omitted. Namely, in contrast to the dominance of the three-dimensional island growth in the AlN layer 7, in the sample that had been subjected to the hydrofluoric acid process and the Ga atomic beam irradiation process, oscillation of RHEED was observed. It was therefore confirmed that the AlN layer was grown in a layer-by-layer mode (i.e., layered two-dimensional growth instead of the island-like three-dimensional growth) on the SiC surface.

The continuation of the RHEED oscillation varies depending on the growth conditions. For example, continuation of oscillation over more than several tens of periods can be confirmed in the growth at lower temperatures. Atomic force microscopic observation of the step structure of the surface where the AlN layer was grown revealed that the attenuation of oscillation at higher temperatures was due to the transition of growth mode from the layer-by-layer growth to the step flow growth. It is noted, however, that the step flow growth is also a two-dimensional growth and is therefore as preferable as the layer-by-layer growth in terms of crystal growth for achieving higher crystal quality. FIG. 3(B) shows the RHEED oscillation in a case where the Group III nitride crystal growth temperature was lowered to about 600 to 700° C. The figure clearly shows the appearance of the RHEED oscillation over 20 or more periods, thus indicating that the layer-by-layer growth can be maintained over a long time by lowering the crystal growth temperature. However, at lower temperatures such as 400° C. or below, the crystallinity greatly deteriorates due to the migration of atoms or an insufficient re-separation of excess raw material. Thus, temperatures of 400° C. or higher are required if high-quality AlN is to be obtained.

Figure 4:
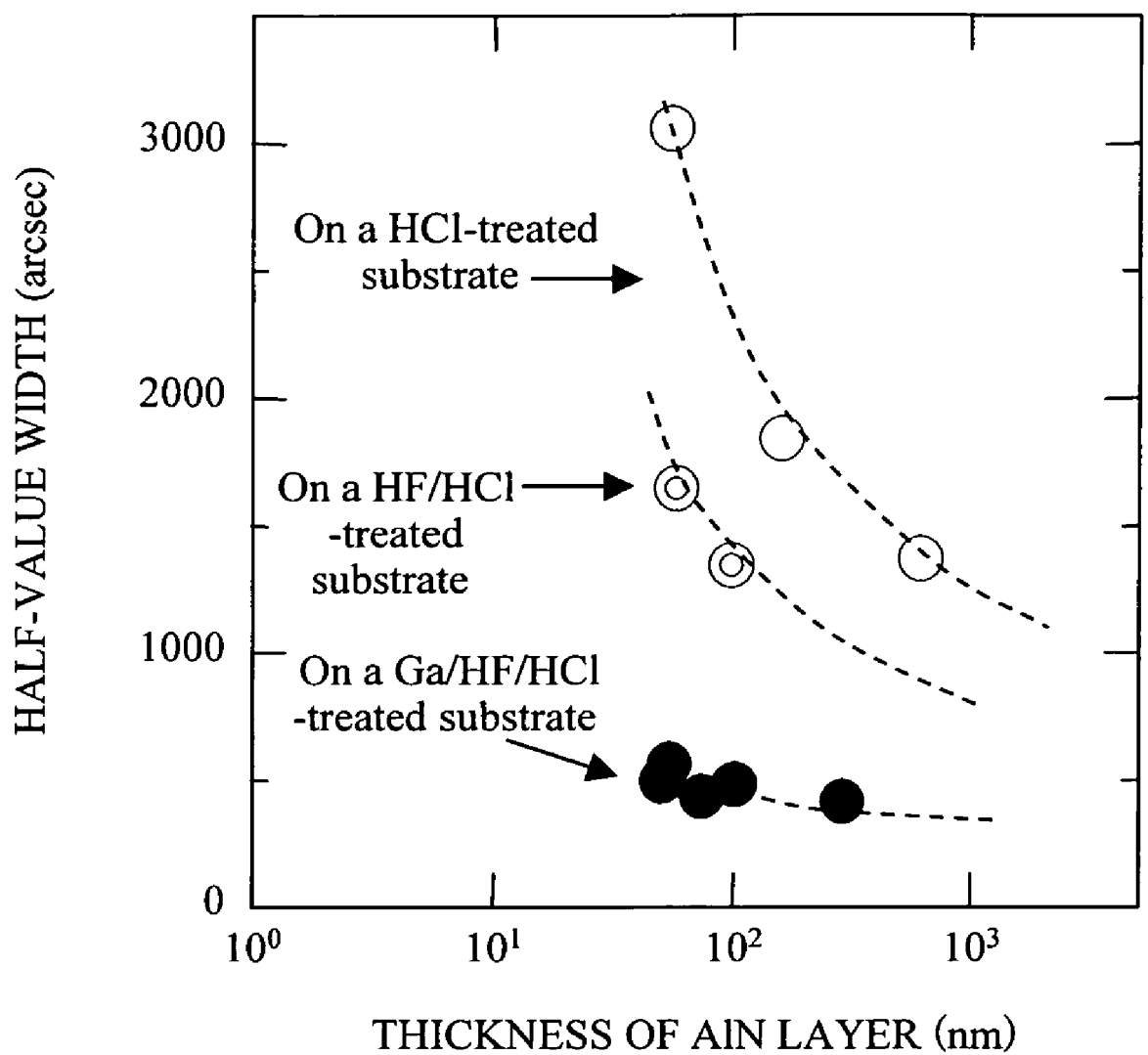
FIG. 4 shows the result of measuring an X-ray rocking curve in an asymmetric plane (01-14) in a sample in which a hydrofluoric acid process and a Ga atomic beam irradiation process were not carried out, in a sample in which the Ga atomic beam irradiation process was not carried out, and in a sample in which both the hydrofluoric acid process and the Ga atomic beam irradiation process were performed.

FIG. 4 shows the result of measuring the X-ray rocking curve in the non-symmetrical plane (01-14) with regard to the above-mentioned three kinds of samples, where –1 is equivalent to 1 to which the bar sign is given at the top. The vertical axis shows the half-value width of the X-ray rocking curve, and the horizontal axis shows the film thickness of the AlN layer. The greater the half-value width of the rocking curve, the more fluctuations there are in the crystal plane, namely, the poorer the quality of crystal. As shown in FIG. 4, in the sample in which neither the hydrofluoric acid process nor the Ga atomic beam irradiation process had been performed, the half-value width is 1000 to 3000 seconds, while in the sample in which only the Ga atomic beam irradiation process had not been performed, the half-value width is 800 to 2000 seconds. In contrast, in the sample in which the hydrofluoric acid process and the Ga atomic beam irradiation process had been performed, the half-value width of the X-ray rocking curve is greatly reduced to 300 to 500 seconds. It is therefore seen that the fluctuation of the crystal plane is very small in the latter and that the crystallinity is very good. This is believed to be the effect of the two-dimensional nuclei of AlN having fused laterally in the initial stages of growth, thereby growing in layers, as a result of realization of the layer-by-layer growth, instead of the growth of the AlN layer in the form of individual three-dimensional islands.

Thus, in accordance with the first embodiment of the invention, after a SiC surface and a surface with common multiples of the total number of the molecules in the SiC surface and the AlN layer that is deposited thereon are prepared, the AlN layer is grown, whereby AlN can be formed on the SiC surface by layer-by-layer growth or step-flow growth (two-dimensional growth). As a result, defects are less likely to be introduced as compared with the conventional case of three-dimensional island growth, such that high-quality crystal growth can be achieved. During the AlN crystal growth, N may be intermittently fed while an Al beam is shone.

There are many steps on the SiC surface prior to the AlN growth. The heights of all of the steps preferably correspond to the least common multiples of the total number of the molecules of SiC and AlN. However, it is known that significant effect for achieving higher quality of the AlN crystal can be obtained even if some steps do not have such height as long as roughly more than half of the steps have such height. It is rather more important for achieving higher quality of the AlN crystal that the chemical processes and the Ga atomic beam irradiation and heating processes are performed appropriately and that the growth temperature of AlN and the feed ratio of Al and N are appropriately set.

With reference to FIG. 2(B), a method of crystal growth according to a variation of the first embodiment is described. As opposed to FIG. 2(A), in the crystal growing method shown in FIG. 2(B), the Ga irradiation is initiated at time t1 while the substrate temperature is maintained at 800° C. When Ga is shone at 800° C., the rate of feeding of Ga to the SiC surface and the rate of separation of Ga from the SiC surface substantially correspond, whereby a kind of equilibrium is achieved. In this state, Ga reacts with the Si oxide film remaining on the SiC surface and evaporates from the substrate surface in the form of Ga oxide with a relatively high vapor pressure. As a result, the Si oxide film on the SiC surface can be eliminated.

At time t2, or prior thereto, the irradiation of Ga is interrupted, and the temperature is increased up to 1000° C. between time t2 and t3. The temperature of 1000° C. is then maintained until t4. Between time t4 to t5, the temperature is lowered to 900° C., which is the growth temperature, and at a certain time to, Al and N are simultaneously fed, whereby AlN is grown. In this method, the silicon oxide film on the SiC surface can be eliminated prior to the growth of AlN.

Alternatively, in FIG. 2(B), Ga may be fed until Δt3 before t4, and then Ga may be removed in the period Δt3.

Figure 5:
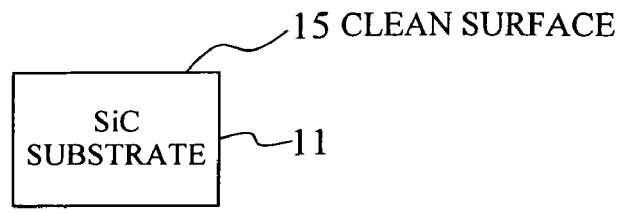
FIG. 5 shows the steps for crystal growth in accordance with a second embodiment of the invention.
Figure 5:
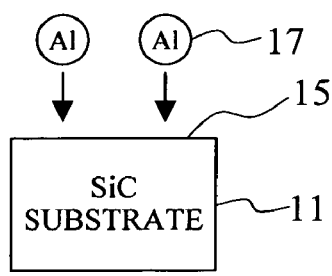
Figure 5:
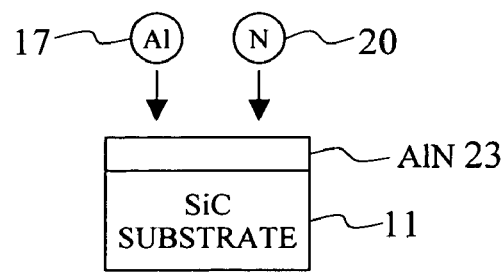
Figure 6:
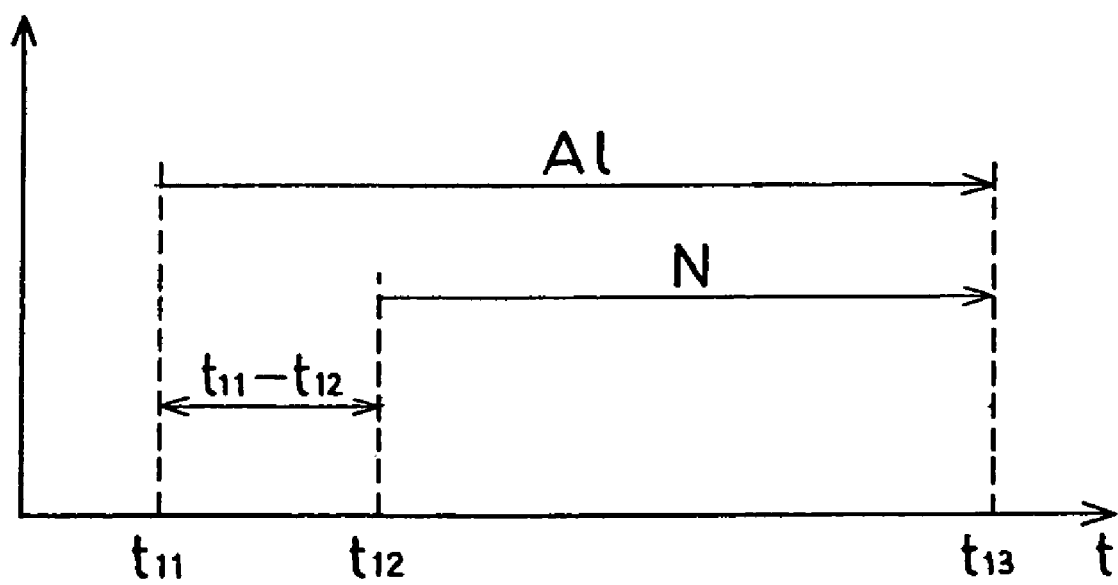
FIG. 6 shows a sequence chart regarding the timing (which is controlled by turning on or off of a shutter, for example, in the case of MBE) of feeding of a growth element before and after the growth of a Group III nitride crystal.

Hereafter, a crystal growth method according to a second embodiment of the invention is described with reference to the drawings. FIG. 5 shows the steps of the crystal growing method according to the present embodiment. FIG. 6 shows a sequence chart regarding the timing of feeding of growth elements (which is controlled by turning on and off of a shutter, for example, in the case of MBE) before and after the crystal growth of a Group III nitride.

In the following, the crystal growth step in the present embodiment is described in detail with reference to FIGS. 5 and 6. As shown in FIG. 5(A), initially a washed 4H—SiC (0001)$_{Si}$ substrate 11 is prepared. Then, a clean surface 15 is formed on the surface of the substrate 11, as in the case of the above-described first embodiment. Thereafter, as shown in FIG. 5(B) and FIG. 6, the Al irradiation is carried out first at time t11. At time t12 (t12−t11=10 s, for example), when the surface of the SiC substrate 11 is substantially entirely covered with Al, rf-plasma excited active nitrogen 20 is fed, as shown in FIG. 5(C). At this time t12, the growth of a AlN layer 23 begins. At t13, the feeding of Al and N is terminated, whereby the growth of the AlN layers 23 stops. As a result, the possibility of the N atoms (rf-plasma excited active nitrogen) 21 directly reacting with the SiC surface 15 is reduced, so that the formation of the unwanted SiN layer, or an excess Si—N bond on the SiC surface 15 can be prevented and therefore the state of interface between the SiC surface 15 and the AlN layer 23 can be favorably maintained. The Al atoms 17 that are fed onto the SiC surface 15 do not necessarily have to form one layer. Less amounts of Al atoms 17, such as an amount corresponding to ⅓ monolayer, for example, may be used in coating the SiC surface 15 in a substantially uniform manner, and thereafter the rf-plasma excited active nitrogen 21 may be fed. (In the c-plane of a hexagonal crystal, a ⅓ or a single monolayer corresponds to regular adsorption.)

Figure 7:
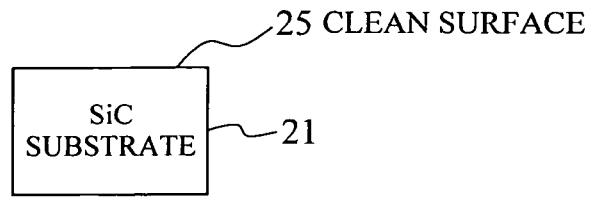
FIG. 7 shows the steps of crystal growth in accordance with a third embodiment of the invention.
Figure 7:
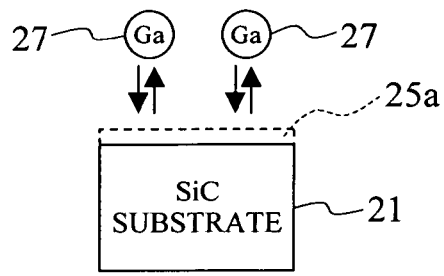
Figure 7:
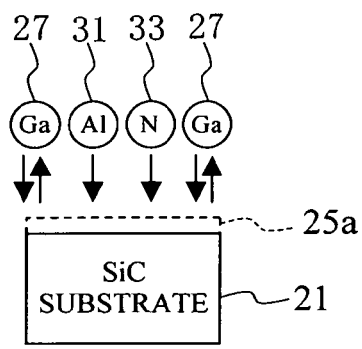
Figure 7:
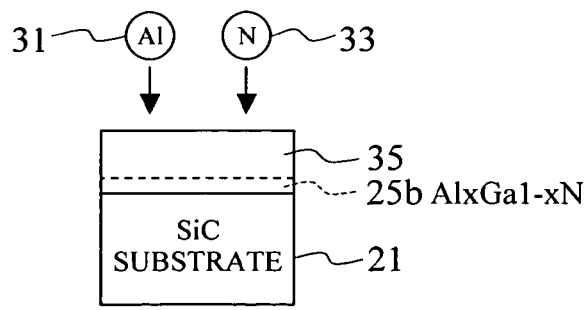

Hereafter, a crystal growing method according to a third embodiment of the invention is described with reference to the drawings. FIG. 7 shows the steps of the crystal growing method according to the present embodiment, and FIG. 8 shows a sequence chart regarding the timing of feeding of growth elements (which is controlled by turning on and off of a shutter, for example, in the case of MBE) before and after the crystal growth of a Group III nitride.

In the following, the crystal growth steps in accordance with the present embodiment will be described with reference to FIGS. 7 and 8. As shown in FIG. 7(A), initially a washed 4H—SiC(0001)$_{Si}$ substrate 21 is prepared. Then a clean surface 25 is formed on the surface of the substrate 21 in the same manner as in the first and second embodiments. Thereafter, as shown in FIG. 7(B) and FIG. 8, at a certain time (time t20), the Ga irradiation is first carried out. Near the growth temperature of AlN, the vapor pressure of Ga is higher than the vapor pressure of Al, so that the components of the Ga atoms that are adsorbed on the surface 25 of the SiC substrate 21 and the components that are evaporated from the surface are substantially equal, whereby a kind of equilibrium is achieved. As a result, a state 25a is created in which Ga in a state of equilibrium is adsorbed on the surface.

Figure 8:
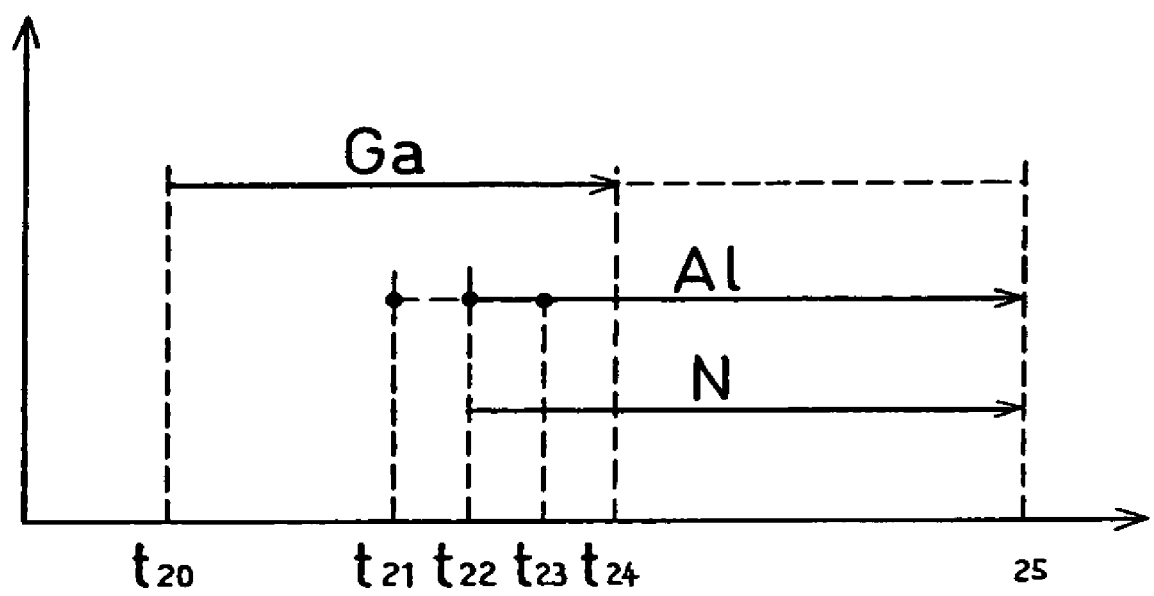
FIG. 8 shows a sequence chart regarding the timing (which is controlled by turning on or off of a shutter, for example, in the case of MBE) of feeding of a growth element before and after the growth of a Group III nitride crystal.

The growth of AlN is initiated by feeding Al and N simultaneously at a certain time (time t22), as shown in FIG. 7(C) and FIG. 8. Because the Ga irradiation is performed for the purpose of controlling the mode of AlN crystal growth at the beginning thereof, the feeding of Ga is terminated after the beginning of AlN growth at time t24.

Because Al and Ga are fed during the period t24 and t22, an Al$_x$Ga$_{1-x}$N layer 25b is formed at the interface of the AlN layer 35 and the SiC substrate 21, as shown in FIG. 7(D). If the presence of an AlGaN layer between SiC and AlN is not preferable for the given purpose, such as when an AlN/SiC MIS structure is to be prepared, it would be necessary to reduce the period t24 to t22 to be sufficiently shorter than the growth time for a monolayer of the AlGaN layer. For example, if the Ga irradiation were to be stopped simultaneously with the start of feeding of Al and N (t22=t24), there would be only a minute amount of Ga at the interface, and the formation of the AlGaN layer could be virtually disregarded. On the other hand, if there are no restrictions as to the SiC/AlN interface structure, such as when a buffer layer for a GaN laser structure is to be prepared, the timing of feeding of Al can be given a certain degree of freedom. Specifically, Al could be fed at t21 prior to the feeding of N at t22, or Al could be fed at t23 following the feeding of N at t22. If feeding were to be started at t21, excess Al could be aggregated on the SiC surface if the preceding irradiation time t22 to t21 is too long, resulting in a poor crystallinity. On the other hand, if feeding were to be started at t23, a GaN layer would be formed because Ga and N would be fed during t23 and t21, whereby a SiC/GaN/AlN structure would be formed. After the AlN layer with a desired thickness is formed, the feeding of Al and N is terminated so as to terminate the growth of the AlN layer.

By thus the irradiation of Ga atoms 27, which re-evaporate and do not become aggregated, first, the formation of an SiN film or excess Si—N bond can be prevented and the mode of AlN crystal growth can be easily rendered into the layer-to-layer growth, even without carrying out the preceding irradiation of the Al atoms 31. In the method according to the second embodiment of the invention, adjustment of the timing of preceding irradiation of Al was required so as to prevent the deterioration of crystallinity due to the aggregation of Al by excess Al irradiation, or the formation of an SiN film due to the lack of Al irradiation. In contrast, in the present embodiment, where the Ga atoms 27, which are more easily evaporated than Al, are used, and the equilibrium state between adsorption and separation of the Ga atoms is utilized, such timing adjustment is advantageously not required.

Instead of Ga, In, which is similarly easily re-evaporated, may be used. In this case, too, the possibility of the rf-plasma excited active nitrogen 33 directly reacting with the SiC surface 25 can be reduced, so that the formation of a SiN layer or the like on the SiC surface 25 can be prevented and, as a result, the state of interface between the SiC surface 25 and the AlN layer 35 can be maintained in a good condition. The feeding of N may be carried out in an intermittent manner. When the growth method involves a gas source for feeding Ga, such as in the case of CBE (chemical beam epitaxy) or MOVPE (metal organic vapor phase epitaxy), an organic metal containing Ga, such as trimethyl gallium or triethyl gallium, would be fed, thereby substantially feeding Ga. The same applies to N, namely, by feeding a nitrogen-containing gas, such as ammonia or hydrazine, N is substantially fed.

Figure 9:
FIG. 9 shows a crystal growing method in accordance with a fourth embodiment of the invention.
Figure 9:
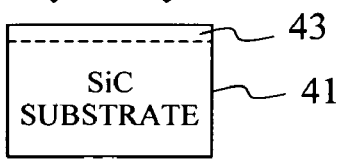
Figure 9:
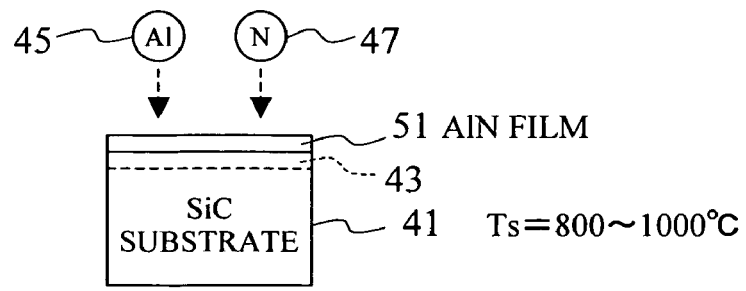

Hereafter, a crystal growing method according to a fourth embodiment of the invention will be described with reference to FIG. 9. In the crystal growth method according to the present embodiment, HCl gas etching was carried out (see FIG. 9(A)) in the same manner as in the crystal growing method according to the first embodiment. Subsequent processes were characteristically carried out in an atmosphere with a smaller oxygen partial pressure than normal. For example, the oxygen partial pressure can be reduced to approximately 0.1 Pa by substituting the gas inside a globe box connected to the sample introducing portion of an MBE apparatus with a high-purity inert gas, such as argon or nitrogen. As shown in FIG. 9(B), the surface 43 of a SiC substrate 41 is cleaned with an aqueous solution containing hydrofluoric acid. The SiC substrate 41 is then introduced into the MBE sample-introducing portion without it coming into contact with oxygen, and the portion is evacuated to a high degree. Then, as shown in FIG. 9(C), under a high vacuum (P=$10^{-6}$ to $10^{-8}$ Pa) within the MBE apparatus, as in the crystal growing methods according to the foregoing embodiments, an AlN film 51 is grown. In this case, it is also important to remove the oxygen dissolved in the aqueous solution containing hydrofluoric acid. This can be achieved by placing the aqueous solution in an environment without oxygen partial pressure, or in the globe box in the above case, for several hours. When this method is used, the number of cycles of the irradiation process involving Si atoms or Ga atoms shown in FIG. 1(C) and the subsequent high-temperature process can be at least reduced, or could be entirely omitted, thereby advantageously simplifying the relevant steps.

Figure 10:
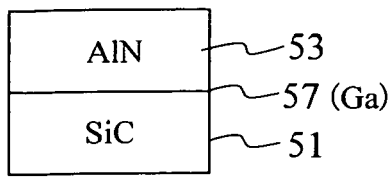
FIGS. 10(A) to (D) shows examples of structures grown by the crystal growing method according to the first or third embodiment of the invention.
Figure 10:
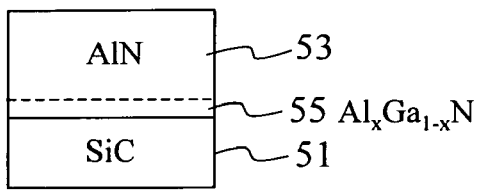
Figure 10:
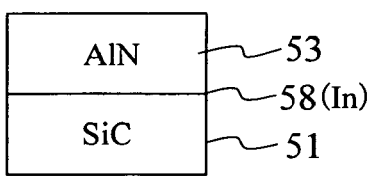
Figure 10:
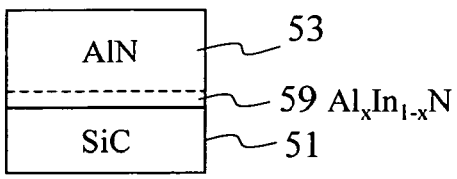

FIG. 10 shows example structures grown by the crystal growing method according to the first or third embodiment of the invention. In the structure shown in FIG. 10(A), there are only Ga atoms on the ppm order remaining between the SiC substrate 1 and the AlN layer 53. In the structure shown in FIG. 10(B), there is formed a thin $Al_xGa_{1-x}N$ layer 55 (x=0 to 1) between the SiC substrate 51 and the AlN layer 53. This is a layer formed by the growth of the AlN layer following the feeding of Ga as shown in FIG. 8. When In is used instead of Ga, In atoms 58 remain between the SiC substrate 51 and the AlN layer 53, as shown in FIG. 10(C). If In on the percentage order is mixed, a thin $Al_xIn_{1-x}N$ layer 59 (x=0 to 1) is formed between the SiC substrate 51 and the AlN layer 53, as shown in FIG. 10(D). This is a layer formed by the growth of the AlN layer following the feeding of Ga or In as shown in FIG. 8. If any of the illustrated structures is present, it can be presumed that the crystal growing method of the invention has been used.

While the first to fourth embodiments of the crystal growing process have been described with reference to the growth of an AlN layer as the Group III nitride, a GaN layer or an $Al_xGa_{1-x}N$ layer can also be formed by the same method. For example, in the case of growing GaN, Ga can be fed instead of Al. In the case of growing $Al_xGa_{1-x}N$, Al and Ga can be fed simultaneously.

Figure 11:
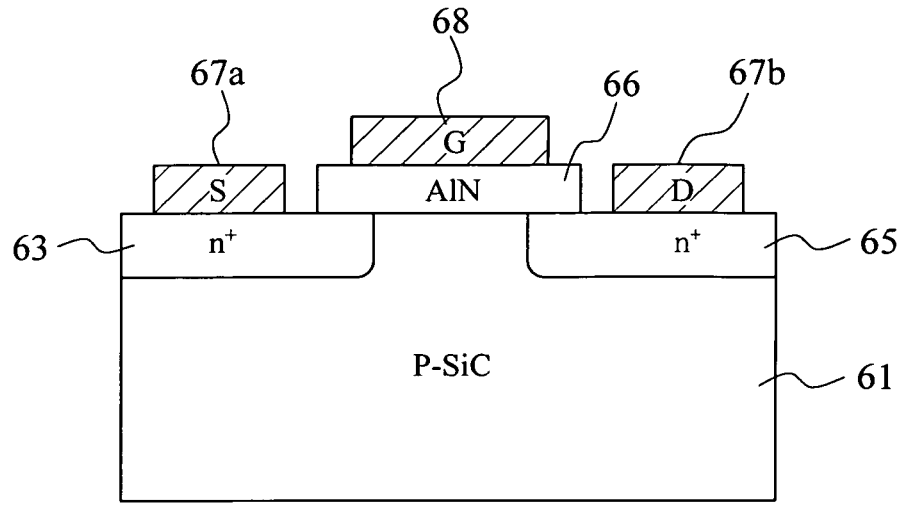
FIG. 11(A) shows an example of the cross-sectional structure of a MISFET in which the band discontinuity and the difference in electron affinity between SiC and AlN are utilized and in which a two-dimensional electron gas layer is used as a channel layer.
FIG. 11(B) shows an energy band structure in a SiC-AlN junction structure.
Figure 11:
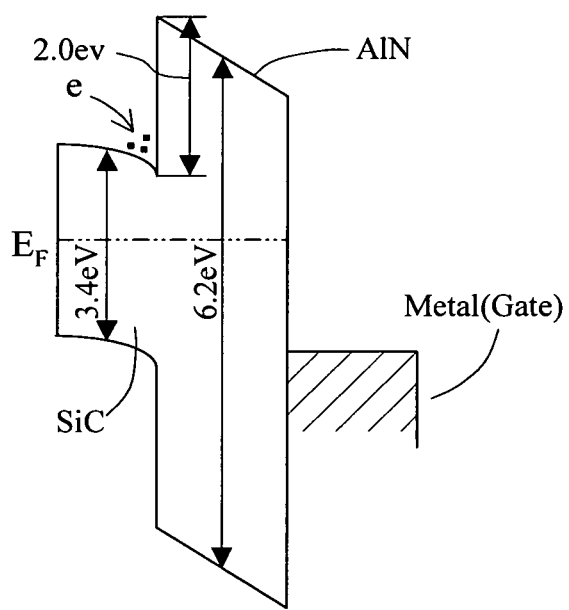

FIG. 11 shows examples of device structures according to the crystal growing method according to any one of the first through third embodiments of the invention. FIG. 11(A) shows an example of the cross-sectional structure of an MISFET in which the band discontinuity between SiC and AlN is utilized and the two-dimensional electron gas layer at the interface is used as a channel. FIG. 11(B) shows an energy band structure in the junction structure of SiC and AlN.

As shown in FIG. 11(A), a heterojunction MISFET comprises a substrate 61 with a SiC surface; a high-quality AlN layer 66 grown on the substrate 61 by the crystal growing technique according to the present embodiment; a gate electrode 68 formed on the AlN layer 66; a source layer 63 and a drain layer 65 that are formed on either side of the gate electrode 68 within SiC and in which high concentrations of impurities are doped; a source electrode 67a formed for the source layer 63; and a drain electrode 67b formed for the drain layer 65.

As shown in FIG. 11(B), between the AlN layer 66 (with a bandgap of approximately 6.2 eV) and the SiC (with a bandgap of approximately 3.4 eV) surface, there is a large band offset. As a result, when the gate electrode is formed on the AlN layer 66, the concentration of two-dimensional electron gas induced at the interface can be controlled by the voltage at the gate electrode, whereby transistor operation can be realized.

An improved AlN crystallinity can be obtained in the above-described AlN/SiC-based MISFET due to the use of the crystal growing technique of the present embodiment, whereby a high-performance MISFET with good gate insulating property and high channel electron mobility can be realized.

Figure 12:
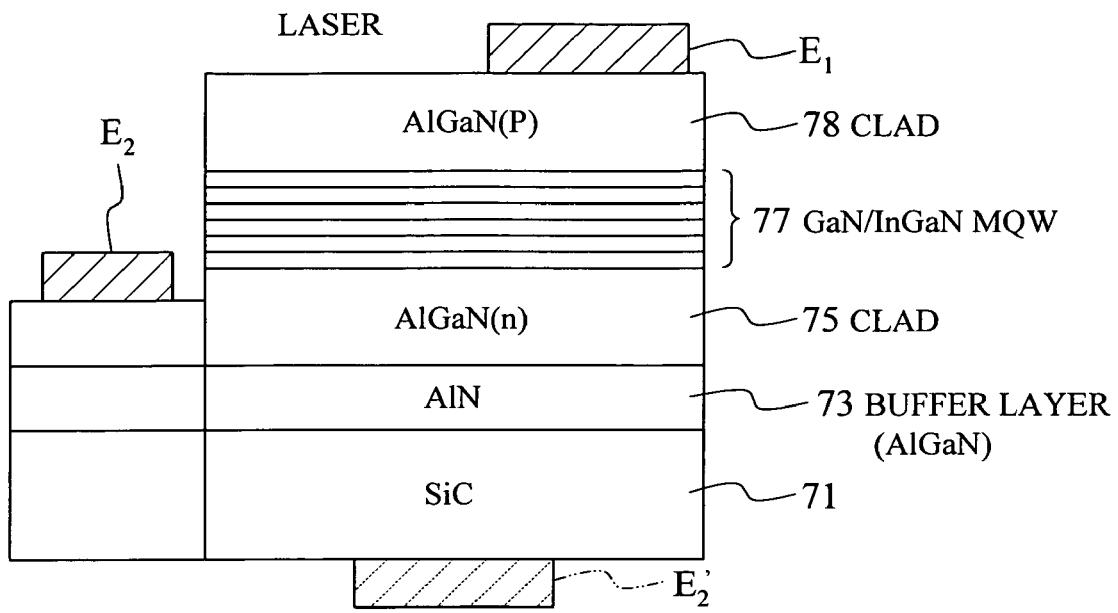
FIG. 12 shows a cross section of a laser structure, illustrating an example in which the crystal growing technique according to an embodiment of the invention is applied to an optical device.

In the following, an example where the crystal growing technique of the present embodiment is applied to an optical device will be described with reference to the drawings. FIG. 12 shows a cross section of a laser structure to which the crystal growing technique has been applied. As shown, a semiconductor laser employing the crystal growing technique of the invention comprises: a substrate 71 with a SiC surface; an AlN buffer layer 73 formed on the substrate 71; an AlGaN (n-type) cladding layer 75; a GaN/InGaN multiquantum well (MQW) structure 77; and an AlGaN (p) cladding layer 78. On top of the AlGaN (p) cladding layer 78, there is formed a first electrode E1. On top of the AlGaN (n-type) cladding layer 75, there is formed a second electrode E2. In this laser structure, too, a good AlN crystal can be formed on the SiC substrate 71, so that the characteristics of the laser operation prepared thereon can be greatly improved, thus contributing to the reduction of the threshold current density of laser and to the increase in the life of the device.

The structure shown in FIG. 12 can be modified by changing the SiC 71 to an n-type and making the AlN layer 73 to be thin enough that a tunnel current can be expected, such as on the order of 10 nm or less. In such a modification, current can be caused to flow vertically. In this case, the second electrode may be formed on a back surface E2' of SiC 71, which would make it possible to omit the step for forming a mesa structure of a Group III nitride. Alternatively, in the structure shown in FIG. 12, SiC 71 may be changed to an n-type, and an n-type AlGaN layer may be used as a buffer layer instead of the AlN layer 73, so that current can be caused to flow vertically.

Figure 13:
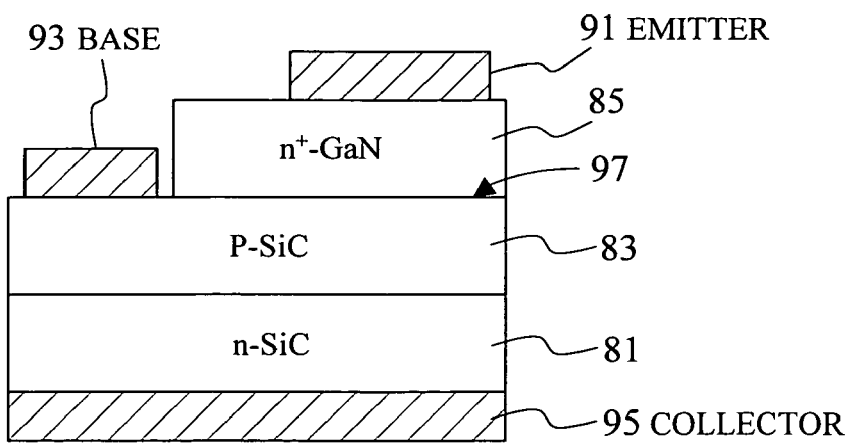
FIG. 13 shows a cross section of a GaN/SiC-based HBT, illustrating an example in which the crystal growing technique according to an embodiment of the invention is applied to an HBT (heterojunction bipolar transistor).

FIG. 13 shows an example of the structure of a heterojunction bipolar transistor (HBT) manufactured by the crystal growing method of the present embodiment. As shown, the HBT has a vertically stacked structure that comprises: a n-SiC substrate 81; a p-SiC layer 83 formed on the substrate; and a n$^+$-GaN layer 85 formed on the p-SiC layer 83. An emitter electrode 91 is formed for the n$^+$-GaN layer 85, a base electrode 93 is formed on the p-SiC layer 83, and a collector electrode 95 is formed on the back surface of the n-SiC substrate 81, thereby forming an HBT. In accordance with the crystal growing method of the present embodiment, a good interface can be obtained between the n+-GaN (Group III nitride) and p-SiC, so that the interface recombination can be prevented and the current amplification factor β, which is an important performance indicator in HBT, can be increased.

As described above, in accordance with the crystal growing technique of the embodiments of the invention, a Group III-N layer can be formed on the SiC surface through the layer-by-layer growth or step-flow growth immediately after the start of the crystal growth. As a result, the introduction of defects that would be caused in the case of an island growth can be reduced, and a thin film can be grown highly accurately. Thus, improved properties can be obtained by applying the invention to electronic devices utilizing the wide bandgap of SiC or to light-emitting optical devices utilizing a Group III nitride.

While the invention has been particularly shown and described with reference to preferred embodiments thereof, it will be understood that various changes in form and details can be made.

INDUSTRIAL APPLICABILITY

The crystal growing technique of the invention, whereby a Group III nitride is formed on an SiC surface through a layer-by-layer growth or a step-flow growth, makes it possible to reduce the introduction of defects and to grow a thin film highly accurately. Therefore, improved device properties can be obtained by applying the invention to the production of electronic devices or optical devices in which the wide bandgap of SiC or a Group III nitride is utilized.

The invention claimed is:
1. A crystal growing method, comprising the steps of:
  forming a step-terrace structure on said SiC surface;
  removing an oxide film which is naturally formed on said surface in an atmosphere of reduced oxygen partial pressure and covers the step-terrace structure;
  after the removing step, performing at least one cycle of a process including irradiating Si or Ga atomic beam on the surface and then heating the irradiated surface thereby separating said Ga or Si from the irradiated surface and removing oxygen on the surface to provide a flat and clean SiC surface; and
  after the performing step, growing a Group-III nitride on the surface without said Ga or Si left in-between while the step-terrace structure is maintained, by adjusting a pre-feeding time of a Group-III element thereby preventing excess aggregation or lack of the Group-III element, feeding the Group III element and feeding nitrogen after the Group III element has been fed.
2. The crystal growing method according to claim 1, wherein said SiC surface has an offset angle of 0-15° with respect to the (0001) Si or (000-1) C plane.
3. A crystal growing method, comprising the steps of:
  forming a step-terrace structure that is flat at an atomic level on a SiC surface and then removing an oxide film, which is naturally formed thereon and covers the step-terrace structure, from the surface;
  after the forming and then removing step, performing at least one cycle of a process including irradiating Si or Ga atomic beam on the surface and then heating the irradiated surface thereby separating said Ga or Si from the irradiated surface and removing oxygen on the surface; and
  after the performing step, growing a Group-III nitride on the surface,
  wherein the Group-III nitride contains Al, and the step of growing a Group-III nitride is conducted under high vacuum and comprises the steps of:
  step-flow-feeding Ga or In as a surface controlling element thereby controlling the mode of crystal growth as layer-by-layer of the Group-III nitride on said SiC surface, and each layer of the Group-III nitride consisting of fused two-dimensional nuclei of the Group-III nitride; and then
  feeding a Group III element and nitrogen, followed by the termination of the feeding of said surface controlling element.
4. The crystal growing method according to claim 3, wherein the surface controlling element is either fed in a form of gas or irradiated on the surface in a form of an atomic beam.
5. The crystal growing method according to claim 3, wherein said SiC surface has an offset angle of 0-15° with respect to the (0001) Si or (000-1) C plane.

* * * * *

UNITED STATES PATENT AND TRADEMARK OFFICE
CERTIFICATE OF CORRECTION

PATENT NO. : 7,625,447 B2 Page 1 of 1
APPLICATION NO. : 10/549683
DATED : December 1, 2009
INVENTOR(S) : Suda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 379 days.

Signed and Sealed this

Second Day of November, 2010

David J. Kappos
*Director of the United States Patent and Trademark Office*